(12) United States Patent
Kim et al.

(10) Patent No.: US 9,865,318 B2
(45) Date of Patent: Jan. 9, 2018

(54) TRANSMISSION CIRCUIT, AND SEMICONDUCTOR APPARATUS AND SYSTEM USING THE SAME

(71) Applicant: SK hynix Inc., Icheon-si, Gyeonggi-do (KR)

(72) Inventors: Kyung Hoon Kim, Icheon-si (KR); Sun Ki Cho, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/286,722

(22) Filed: Oct. 6, 2016

(65) Prior Publication Data

US 2017/0345474 A1 Nov. 30, 2017

(30) Foreign Application Priority Data

May 30, 2016 (KR) .......................... 10-2016-0066221

(51) Int. Cl.
| | | |
|---|---|---|
| *G11C 7/00* | (2006.01) | |
| *G11C 8/18* | (2006.01) | |
| *G11C 7/10* | (2006.01) | |
| *G11C 7/12* | (2006.01) | |

(52) U.S. Cl.
CPC .............. *G11C 8/18* (2013.01); *G11C 7/1072* (2013.01); *G11C 7/12* (2013.01)

(58) Field of Classification Search
CPC ............ G11C 8/18; G11C 7/1072; G11C 7/12
USPC .......................................................... 365/198
See application file for complete search history.

(56) References Cited

U.S. PATENT DOCUMENTS

| | | | | |
|---|---|---|---|---|
| 7,460,417 | B2* | 12/2008 | Kim ...................... | G11C 7/1066 365/191 |
| 7,990,782 | B2* | 8/2011 | Lee .......................... | G11C 7/02 365/148 |
| 2006/0203573 | A1* | 9/2006 | Kim ...................... | G11C 7/1051 365/193 |
| 2010/0165760 | A1* | 7/2010 | Lee .......................... | G11C 7/02 365/193 |

FOREIGN PATENT DOCUMENTS

KR     1020100078208 A     7/2010

* cited by examiner

*Primary Examiner* — Richard Elms
*Assistant Examiner* — Xiaochun L Chen
(74) *Attorney, Agent, or Firm* — William Park & Associates Ltd.

(57) ABSTRACT

A transmission circuit may be provided. The transmission circuit may include a strobe control circuit and an output driver. The strobe control circuit may generate strobe driving signals based on information and a clock signal. The output driver may generate a strobe signal by driving a signal transmission line. The transmission circuit may drive the signal transmission line to a specified level for a predetermined time after transmission of the strobe signal is completed.

11 Claims, 5 Drawing Sheets

TRANSMISSION CIRCUIT, AND SEMICONDUCTOR APPARATUS AND SYSTEM USING THE SAME

CROSS-REFERENCES TO RELATED APPLICATION

The present application claims priority under 35 U.S.C. §119(a) to Korean application number 10-2016-0066221, filed on May 30, 2016, in the Korean Intellectual Property Office, which is incorporated herein by reference in its entirety.

BACKGROUND

1. Technical Field

Various embodiments may generally relate to a semiconductor technology, and, more particularly, to a method, a transmission circuit, and a semiconductor apparatus and a system relating to transmissions.

2. Related Art

Electronic apparatuses include a large number of electronic components. Among the electronic apparatuses, a computer system includes many electronic components which are constructed by semiconductors. Semiconductor apparatuses which construct a computer system transmit data in synchronization with a clock signal, and perform serial communication. One semiconductor apparatus includes a transmission circuit which transmits data and a clock signal, to transmit data to another semiconductor apparatus. Also, one semiconductor apparatus includes a reception circuit which receives data and a clock signal, to receive data transmitted from another semiconductor apparatus.

The semiconductor apparatuses are coupled by a signal transmission line such as a bus. Data is transmitted between the semiconductor apparatuses through a data bus, and the clock signal is transmitted between the semiconductor apparatuses through a clock bus. Because each of the bus, the transmission circuit and the reception circuit has their capacitance, even in the case where transmission of a signal is completed, a signal reflection phenomenon may occur due to energy remaining in the bus. Therefore, the bus may cause an unnecessary toggling or ringing until the remaining energy is exhausted.

SUMMARY

In an embodiment, a system may be provided. In an embodiment, a method may be provided. In an embodiment, a transmission circuit may be provided. The transmission circuit may include a strobe control circuit and an output driver. The strobe control circuit may generate strobe driving signals based on information and a clock signal. The output driver may generate a strobe signal by driving a signal transmission line. The transmission circuit may drive the signal transmission line to a specified level for a predetermined time after transmission of the strobe signal is completed.

DETAILED DESCRIPTION

Hereinafter, a transmission circuit, and a semiconductor apparatus and a system including the same will be described below with reference to the accompanying drawings through various examples of embodiments.

Embodiments may provide a transmission circuit capable of extending a postamble and thereby preventing unnecessary toggling of a signal transmission line, and a semiconductor apparatus and a system using the same.

Figure 1:
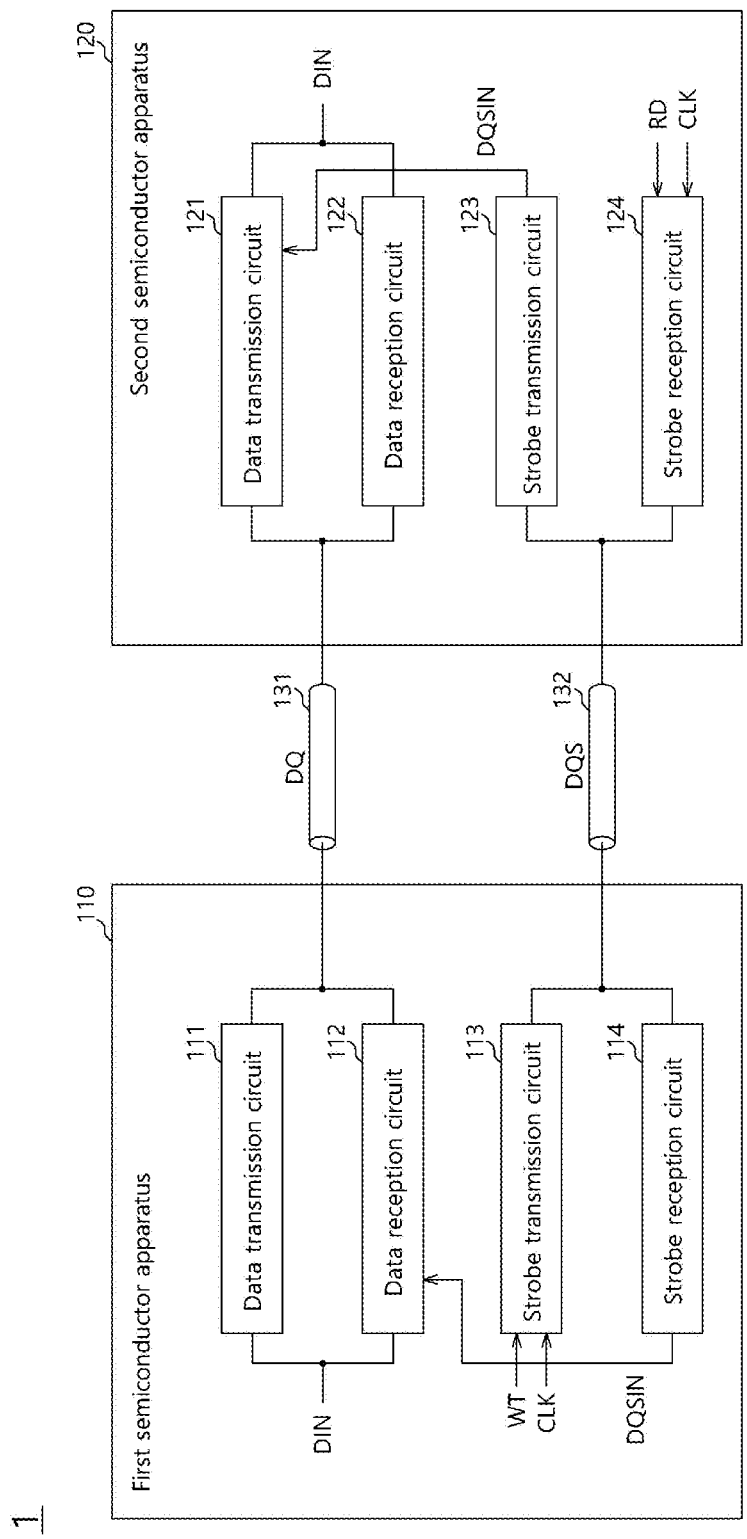
FIG. 1 is a diagram illustrating a representation of an example of the configuration of a system in accordance with an embodiment.

FIG. 1 is a diagram illustrating a representation of an example of the configuration of a system in accordance with an embodiment. Referring to FIG. 1, a system 1 in accordance with an embodiment may include a first semiconductor apparatus 110 and a second semiconductor apparatus 120. The first semiconductor apparatus 110 and the second semiconductor apparatus 120 may be electronic components which communicate with each other. In an embodiment, the first semiconductor apparatus 110 may be a master apparatus, and the second semiconductor apparatus 120 may be a slave apparatus which operates by being controlled by the first semiconductor apparatus 110. For example, the first semiconductor apparatus 110 may be a host such as a processor, and the processor may include a central processing unit (CPU), a graphic processing unit (GPU), a multimedia processor (MMP) or a digital signal processor (DSP). Also, the first semiconductor apparatus 110 may be realized in the form of a system-on-chip (SOC) by combining processor chips having various functions, such as application processors. The second semiconductor apparatus 120 may be a memory, and the memory may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The first and second semiconductor apparatuses 110 and 120 may be coupled with each other through a plurality of signal transmission lines 131 and 132. The signal transmission lines 131 and 132 may be channels, links or buses. A first signal transmission line 131 may be a data bus which transmits data DQ. A second signal transmission line 132 may be a strobe bus or a clock bus which transmits a clock signal such as a strobe signal DQS. The first semiconductor apparatus 110 may include a data transmission circuit 111, a data reception circuit 112, a strobe transmission circuit 113, and a strobe reception circuit 114. The data transmission circuit and strobe transmission circuit 111 and 113 may generate output signals according to internal signals of the first semiconductor apparatus 110, and transmit the output signals to the second semiconductor apparatus 120 through the signal transmission lines 131 and 132, respectively. The data transmission circuit 111 may generate the data DQ according to internal data DIN of the first semiconductor apparatus 110, and transmit the data DQ to the second semiconductor apparatus 120 through the first signal transmission line 131. The strobe transmission circuit 113 may generate the strobe signal DQS or a clock signal which is synchronized with a point of time at which the data DQ is outputted, and transmit the strobe signal DQS to the second semiconductor apparatus 120 through the second signal transmission line 132. The data reception circuit and strobe reception circuit 112 and 114 may receive signals transmitted from the second semiconductor apparatus 120 through the signal transmission lines 131 and 132, respectively, and generate internal signals. The data reception circuit 112 may receive the data DQ transmitted through the first signal transmission line 131, and generate the internal data DIN. The strobe reception circuit 114 may receive the strobe signal DQS transmitted through the second signal transmission line 132, and generate an internal strobe signal DQSIN or a clock signal which is needed in generating the internal data DIN.

Similarly, the second semiconductor apparatus 120 may include a data transmission circuit 121, a data reception circuit 122, a strobe transmission circuit 123, and a strobe reception circuit 124. The data transmission circuit 121 and strobe transmission circuit 123 may generate output signals according to internal signals of the second semiconductor apparatus 120, and transmit the output signals to the first semiconductor apparatus 110 through the signal transmission lines 131 and 132, respectively. The data transmission circuit 121 may generate the data DQ according to internal data DIN of the second semiconductor apparatus 120, and transmit the data DQ to the first semiconductor apparatus 110 through the first signal transmission line 131. The strobe transmission circuit 123 may generate the strobe signal DQS which is synchronized with a point of time at which the data DQ is outputted, and transmit the strobe signal DQS to the first semiconductor apparatus 110 through the second signal transmission line 132. The data reception circuit and strobe reception circuit 122 and 124 may receive signals transmitted from the first semiconductor apparatus 110 through the signal transmission lines 131 and 132, respectively, and generate internal signals. The data reception circuit 122 may receive the data DQ transmitted through the first signal transmission line 131, and generate the internal data DIN. The strobe reception circuit 124 may receive the strobe signal DQS transmitted through the second signal transmission line 132, and generate an internal strobe signal DQSIN which is needed in generating the internal data DIN.

The first and second semiconductor apparatuses 110 and 120 may perform serial communication, and the signal transmission line 131 may transmit data of a serial type. In order to quickly process a large amount of data, the first and second semiconductor apparatuses 110 and 120 may convert data of a serial type into data of a parallel type and use the converted data of a parallel type. The data DQ may be serial type data, and the internal data DIN may be parallel type data. Each of the data transmission circuits 111 and 121 may include a serializer for converting the internal data DIN of a parallel type into the data DQ of a serial type. Each of the data reception circuits 112 and 122 may include a parallelizer for converting the data DQ of a serial type into the internal data DIN of a parallel type.

The strobe transmission circuit 113 may generate the strobe signal DQS based on an operation information and a clock signal CLK. When an operation for the first semiconductor apparatus 110 to transmit the data DQ to the second semiconductor apparatus 120 is defined as a write operation, the operation information may be an information associated with the write operation. The strobe transmission circuit 113 may generate the strobe signal DQS based on a write information WT and the clock signal CLK. The strobe transmission circuit 123 may generate the strobe signal DQS based on an operation information and the clock signal CLK. When an operation for the second semiconductor apparatus 120 to transmit the data DQ to the first semiconductor apparatus 110 is defined as a read operation, the operation information may be an information associated with the read operation. The strobe transmission circuit 123 may generate the strobe signal DQS based on a read information RD and the clock signal CLK.

The strobe reception circuit 114 may delay the strobe signal DQS received through the second signal transmission line 132, and generate the internal strobe signal DQSIN. The strobe reception circuit 114 may include a delay which delays the strobe signal DQS and generates the internal strobe signal DQSIN. The strobe reception circuit 114 may provide the internal strobe signal DQSIN to the data reception circuit 112. The strobe reception circuit 124 may delay the strobe signal DQS received through the second signal transmission line 132, and generate the internal strobe signal DQSIN. The strobe reception circuit 124 may include a delay which delays the strobe signal DQS and generates the internal strobe signal DQSIN. The strobe reception circuit 124 may provide the internal strobe signal DQSIN to the data reception circuit 122.

Figure 2:
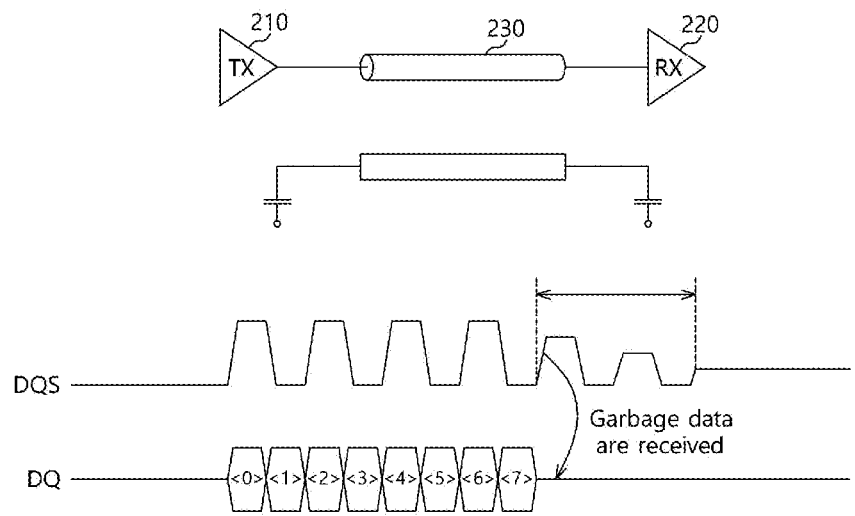
FIG. 2 is a diagram illustrating a representation of an example of a coupling relationship between a transmission circuit and a reception circuit and a mis-operation likely to occur due to energy remaining in a signal transmission line.

FIG. 2 is a diagram illustrating a representation of an example of a coupling relationship between a transmission circuit TX 210 and a reception circuit RX 220 and a mis-operation likely to occur due to a reflection or remaining energy of a signal transmission line 230. Referring to FIG. 2, the transmission circuit 210 may be coupled with the reception circuit 220 through a signal transmission line 230. The signal transmission line 230 may transmit a strobe signal DQS. If transmission of the strobe signal DQS is completed, the transmission circuit 210 and the reception circuit 220 may be turned off, and may become equivalent circuits to capacitors. After the last pulse of the strobe signal DQS is transmitted, energy may remain in the signal transmission line 230. Therefore, the remaining energy may cause a reflection between the transmission circuit 210 and the reception circuit 220 which may be regarded as capacitors. As a result, a toggling or ringing of the strobe signal DQS may occur in an unwanted period such as the period indicated by the arrow in FIG. 2. Referring to FIG. 1, the data reception circuit 122 may receive the data DQ in synchronization with the strobe signal DQS. The data reception circuit 122 may latch eight data DQ<0:7> received in synchronization with the rising edges and falling edges of the strobe signal DQS, and generate the internal data DIN. At this time, even though transmission of the strobe signal DQS and the data DQ<0:7> is completed, there is a possibility of garbage data to be received in synchronization with the pulses of the strobe signal DQS which are generated in the unwanted period.

Figure 3:
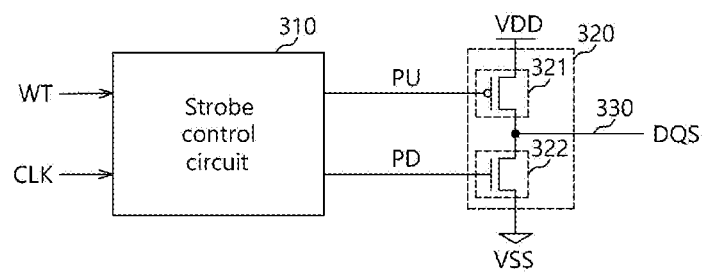
FIG. 3 is a diagram illustrating a representation of an example of the configuration of a transmission circuit in accordance with an embodiment.

FIG. 3 is a diagram illustrating a representation of an example of the configuration of a transmission circuit 300 in accordance with an embodiment. Referring to FIG. 3, the transmission circuit 300 may include a strobe control circuit 310 and an output driver 320. The transmission circuit 300 may be applied as the strobe transmission circuits 113 and 123 illustrated in FIG. 1. In particular, FIG. 3 exemplifies the transmission circuit 300 which may be applied as the strobe transmission circuit 113 of the first semiconductor apparatus 110. The strobe control circuit 310 may generate strobe driving signals PU and PD based on an operation information and a clock signal CLK. The operation information may be write information WT. The write information WT may include any information for a write operation. The write operation may be an operation for storing data of one semiconductor apparatus in another semiconductor apparatus. For example, the write operation may be defined as an operation in which the first semiconductor apparatus 110 transmits data to the second semiconductor apparatus 120 and the second semiconductor apparatus 120 stores received data. Therefore, the write information WT may include information on an operation for a semiconductor apparatus to perform. For example, the information on an operation may include a command signal. The write information WT may include information on a time required to perform the write operation. The information on a time may include a write latency and a burst length. The write latency may be information corresponding to a time from after a command signal commanding a write operation is generated to when the write operation is actually performed in a semiconductor apparatus. The burst length may be information corresponding to the number of data transmission times when a write operation is performed as a command signal is generated one time. For example, in the case where a burst length is 8, a semiconductor apparatus may transmit data eight times. The strobe control circuit 310 may generate the strobe driving signals PU and PD based on the write information WT and the clock signal CLK. In an embodiment, the write information may include information on an operation for a semiconductor apparatus to perform and information on a time required for the operation.

In the case where the transmission circuit 300 is applied as the strobe transmission circuit 123 of the second semiconductor apparatus 120, the transmission circuit 300 may receive a read information RD instead of the write information WT. The read information RD may include any information for a read operation. The read operation may be an operation of outputting data stored in one semiconductor apparatus to another semiconductor apparatus. For example, the read operation may be defined as an operation for the semiconductor apparatus 120 to provide data stored therein to the first semiconductor apparatus 110. The read information RD may include a command signal associated with an operation for a semiconductor apparatus to perform. The read information RD may include information on a time required to perform the read operation. The information on a time may include a read latency and a burst length.

The output driver 320 may be coupled with a signal transmission line 330 which transmits the strobe signal DQS. The signal transmission line 330 may be a strobe bus. The output driver 320 may transmit the strobe signal DQS by driving the signal transmission line 330 based on the strobe driving signals PU and PD. The strobe driving signals PU and PD may include a pull-up strobe driving signal PU and a pull-down strobe driving signal PD. The output driver 320 may include a pull-up driver 321 and a pull-down driver 322. The pull-up driver 321 may be coupled between a power supply voltage VDD and the signal transmission line 330, and the pull-down driver 322 may be coupled between the signal transmission line 330 and a ground voltage VSS. The pull-up driver 321 may drive the signal transmission line 330 to a high level in response to the pull-up strobe driving signal PU. The pull-down driver 322 may drive the signal transmission line 330 to a low level in response to the pull-down strobe driving signal PD.

The transmission circuit 300 may drive the signal transmission line 330 to a specified level for a predetermined time after the write operation of a semiconductor apparatus is completed. For example, the transmission circuit 300 may drive the signal transmission line 330 to a low level for the predetermined time. The transmission circuit 300 may drive the signal transmission line 330 to a specified level to prevent an unwanted toggling or ringing from occurring, by removing energy remaining in the signal transmission line 330 when the write operation and transmission of the strobe signal DQS are completed. The strobe control circuit 310 may generate the strobe driving signals PU and PD such that the strobe signal DQS may be driven to a specified level for the predetermined time after the write operation is completed based on the write information WT.

Figure 4:
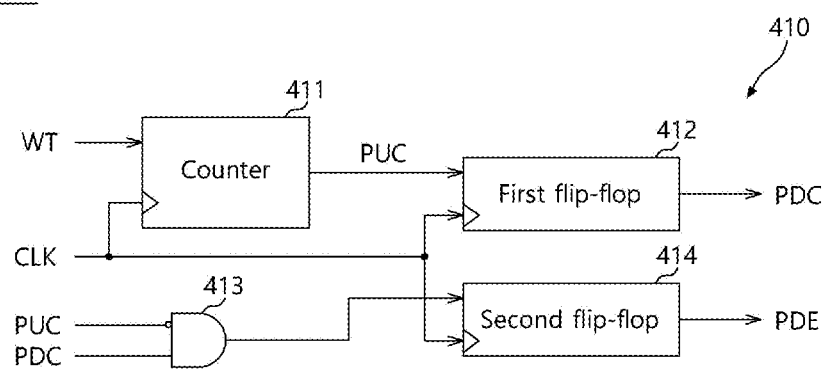
FIG. 4 is a diagram illustrating a representation of an example of the configuration of a strobe control circuit in accordance with an embodiment.
Figure 4:
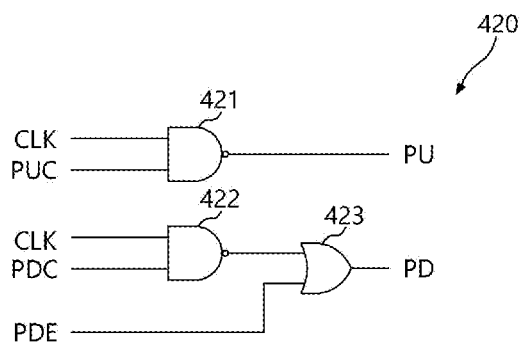

FIG. 4 is a diagram illustrating a representation of an example of the configuration of a strobe control circuit 400 in accordance with an embodiment. The strobe control circuit 400 may be applied as the strobe control circuit 310 of FIG. 3. Referring to FIG. 4, the strobe control circuit 400 may include a control signal generation circuit 410 and a strobe driving signal generation circuit 420. The control signal generation circuit 410 may generate a pull-up control signal PUC, a pull-down control signal PDC and a postamble extension signal PDE based on the write information WT and the clock signal CLK. The strobe driving signal generation circuit 420 may generate the pull-up strobe driving signal PU and the pull-down strobe driving signal PD based on the pull-up control signal PUC, the pull-down control signal PDC and the postamble extension signal PDE.

The control signal generation circuit 410 may include a counter 411, a first flip-flop 412, an AND gate 413, and a second flip-flop 414. The counter 411 may receive the write signal WT and the clock signal CLK. The counter 411 may enable the pull-up control signal PUC for a time in which a semiconductor apparatus performs a write operation, based on the write information WT. The counter 411 may count times corresponding to the write latency and the burst length, by using the clock signal CLK. For example, the counter 411 may enable the pull-up control signal PUC when a time corresponding to the write latency is elapsed after a command signal is inputted, and disable the pull-up control signal PUC when a time corresponding to the burst length is elapsed thereafter. The counter 411 may enable the pull-up control signal PUC before the time corresponding to the write latency is elapsed, to generate the preamble of the strobe signal DQS. The first flip-flop 412 may receive the pull-up control signal PUC and the clock signal CLK. The first flip-flop 412 may delay the pull-up control signal PUC in synchronization with the clock signal CLK, and thereby generate the pull-down control signal PDC. The AND gate 413 may perform a calculation operation based on the pull-up control signal PUC and the pull-down control signal PDC. The AND gate 413 may receive the inverted signal of the pull-up control signal PUC and the pull-down control signal PDC, and thereby generate a pulse signal for generating the postamble extension signal PDE. The second flip-flop 414 may receive the output of the AND gate 413 and the clock signal CLK. The second flip-flop 414 may delay the output of the AND gate 413 in synchronization with the clock signal CLK, and thereby generate the postamble extension signal PDE. In an embodiment, the AND gate 413 may include for example any combination of circuits to perform a logic AND operation and may receive the inverted signal of the pull-up control signal PUC and the pull-down control signal PDC and perform the AND operation with the signals to generate a pulse signal for generating the postamble extension signal PDE with the second flip-flop 414.

The strobe driving signal generation circuit 420 may include a first NAND gate 421, a second NAND gate 422, and an OR gate 423. The first NAND gate 421 may receive the clock signal CLK and the pull-up control signal PUC, and thereby output the pull-up strobe driving signal PU. The first NAND gate 421 may provide the pull-up strobe driving signal PU by inverting the clock signal CLK when the pull-up control signal PUC is enabled. The second NAND gate 422 may receive the clock signal CLK and the pull-down control signal PDC. The second NAND gate 422 may output an output by inverting the clock signal CLK when the pull-down control signal PDC is enabled. The OR gate 423 may receive the output of the second NAND gate 422 and the postamble extension signal PDE, and generate the pull-down strobe driving signal PD. Therefore, the pull-down strobe driving signal PD may be generated based on not only the pull-down control signal PDC but also the postamble extension signal PDE.

Figure 5:
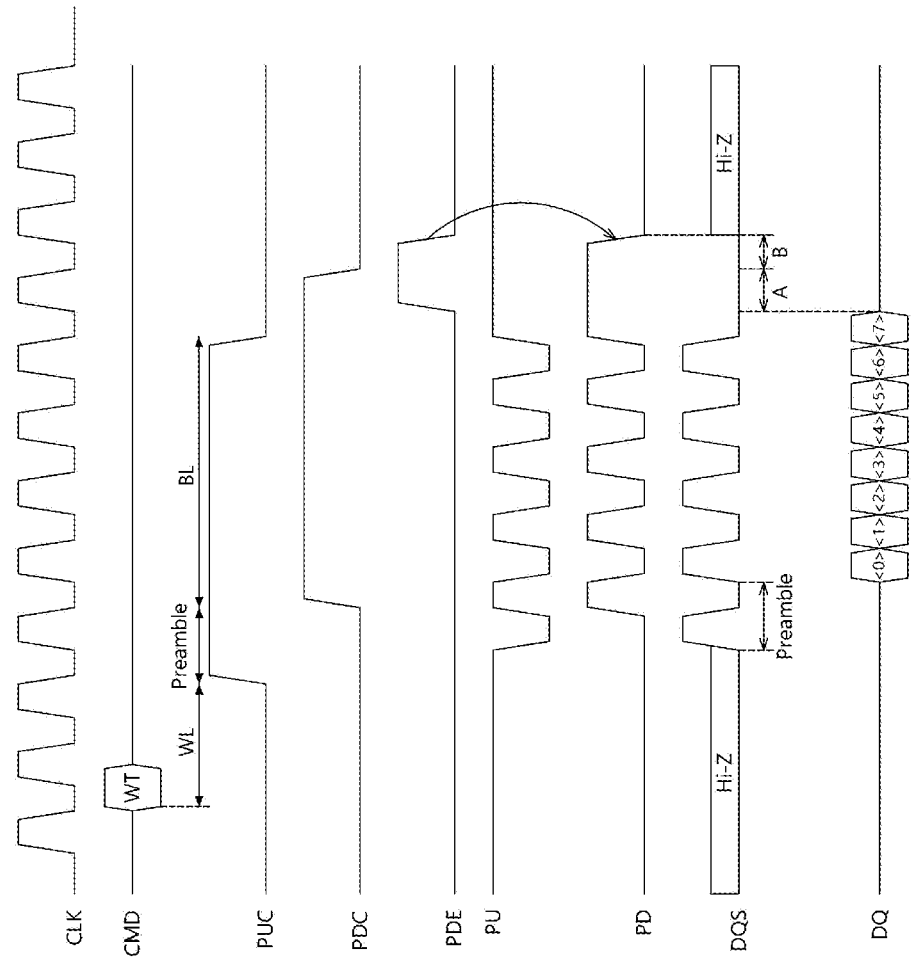
FIG. 5 is a representation of an example of a timing diagram to assist in the explanation of operations of the transmission circuit and semiconductor apparatuses in accordance with embodiments.

FIG. 5 is a representation of an example of a timing diagram to assist in the explanation of operations of the transmission circuit and the semiconductor apparatuses in accordance with the embodiments. The operations of the semiconductor apparatuses and the transmission circuit in accordance with the embodiments will be described below with reference to FIGS. 1 to 5. Descriptions will be, for example, for the case where the first and second semiconductor apparatuses 110 and 120 of FIG. 1 are a memory controller and a memory, respectively. In order to transmit data to the memory 120, the memory controller 110 may generate a write command signal CMD (i.e., WT) and transmit the write command signal CMD to the memory 120. If the write command signal CMD is generated, the counter 411 may generate the pull-up control signal PUC after a time corresponding to a write latency WL is elapsed. The pull-up control signal PUC may be enabled earlier by, for example, 1 cycle of the clock signal CLK, than a time at which data is actually outputted, such that the preamble of the strobe signal DQS may be generated. The counter 411 enables the pull-up control signal PUC for a time corresponding to a burst length BL. The strobe driving signal generation circuit 420 may output the pull-up strobe driving signal PU by inverting the clock signal CLK when the pull-up control signal PUC is in an enabled state. The first flip-flop 412 may generate the pull-down control signal PDC by delaying the pull-up control signal PUC. The AND gate 413 may generate a pulse signal by calculating the inverted signal of the pull-up control signal PUC and the pull-down control signal PDC, and the second flip-flop 414 may generate the postamble extension signal PDE by delaying the pulse signal.

The strobe driving signal generation circuit 420 may output the pull-down strobe driving signal PD by inverting the clock signal CLK when the pull-down control signal PDC is in an enabled state. Also, the strobe driving signal generation circuit 420 may output the postamble extension signal PDE as the pull-down strobe driving signal PD, even though the pull-down control signal PDC is disabled.

When the output driver 320 is turned off, the strobe signal DQS may retain a high impedance state Hi-Z. The output driver 320 may generate the strobe signal DQS in response to the pull-up strobe driving signal PU and the pull-down strobe driving signal PD. A period between the first rising edge and the first falling edge of the strobe signal DQS may be a preamble. Data DQ<0:7> may be outputted in synchronization with respective edges in a period between the second rising edge and the fifth falling edge of the strobe signal DQS. If transmission of the data DQ<0:7> is completed, the transmission circuit 300 in accordance with an embodiment may have an extended postamble period A+B including a general postamble period A, based on the postamble extension signal PDE. The general postamble period A may correspond to a postamble generated according to the specification of a system or according to the conventional art. Thus, as a time in which energy remaining in the signal transmission line 330 for transmitting the strobe signal DQS is removed is secured, it is possible to prevent occurrence of a reflection. If the pull-down strobe driving signal PD is disabled in synchronization with the postamble extension signal PDE, an extended postamble period B may be ended, the output driver 320 may be turned off, and the strobe signal DQS may be a high impedance state Hi-Z.

Figure 6:
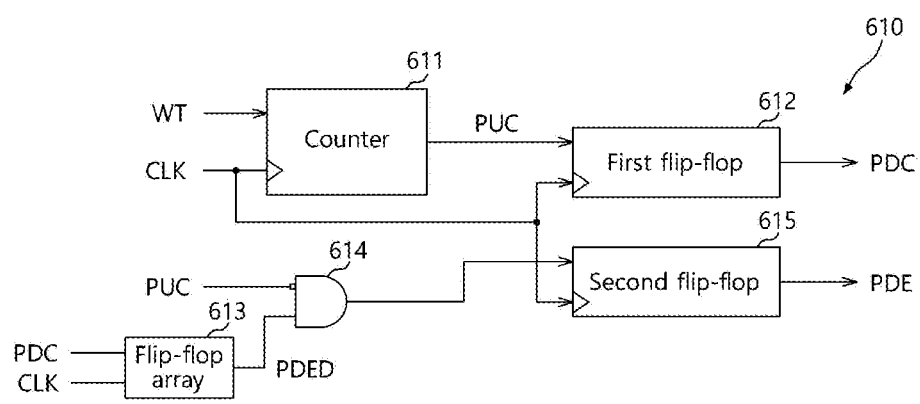
FIG. 6 is a diagram illustrating a representation of an example of the configuration of a strobe control circuit in accordance with an embodiment.
Figure 6:
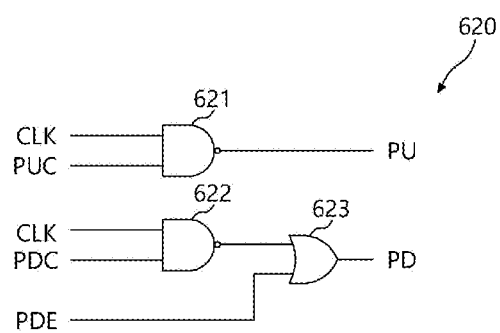

FIG. 6 is a diagram illustrating a representation of an example of the configuration of a strobe control circuit 600 in accordance with an embodiment. The strobe control circuit 600 may be applied as the strobe control circuit 310 illustrated in FIG. 3. The strobe control circuit 600 may adjust variously the extended period of the postamble of the strobe signal DQS. The strobe control circuit 600 may include a control signal generation circuit 610 and a strobe driving signal generation circuit 620. The control signal generation circuit 610 may include a counter 611, a first flip-flop 612, a flip-flop array 613, an AND gate 614, and a second flip-flop 615. The counter 611 may generate the pull-up control signal PUC based on the write information WT and the clock signal CLK. The first flip-flop 612 may generate the pull-down control signal PDC by delaying the pull-up control signal PUC. The flip-flop array 613 may include a plurality of flip-flops, and receive the pull-down control signal PDC and the clock signal CLK. The flip-flop array 613 may generate a pulse width adjustment signal PDED by variably delaying the pull-down control signal PDC. The AND gate 614 may perform a calculation operation by receiving the inverted signal of the pull-up control signal PUCB and the pulse width adjustment signal PDED. The second flip-flop 615 may generate the postamble extension signal PDE by delaying the output of the AND gate 614. Since the control signal generation circuit 610 may generate the pulse width adjustment signal PDED by variably delaying the pull-down control signal PDC through the flip-flop array 613, the enable period of the postamble extension signal PDE may be changed variously, and the postamble period of the strobe signal DQS may be extended as desired. The strobe driving signal generation circuit 620 may include a first NAND gate 621, a second NAND gate 622, and an OR gate 623. Because the strobe driving signal generation circuit 620 has substantially the same configuration as the strobe driving signal generation circuit 420 of FIG. 4, a description thereof will be omitted. In an embodiment, the AND gate 614 may include for example any combination of circuits to perform a logic AND operation and may receive the inverted signal of the pull-up control signal PUC and the pulse width adjustment signal PDED and perform the AND operation with the signals to generate an output signal for generating the postamble extension signal PDE with the second flip-flop 615.

While various embodiments have been described above, it will be understood to those skilled in the art that the embodiments described are examples only. Accordingly, the transmission circuit, and the semiconductor apparatus and the system including the same described herein should not be limited based on the described embodiments.

What is claimed is:

1. A transmission circuit comprising:
   a strobe control circuit configured to generate strobe driving signals based on write information and a clock signal; and
   an output driver configured to generate a strobe signal by driving signal transmission lines based on the strobe driving signals,
   wherein the signal transmission lines are driven to a specified level for a predetermined time after transmission of the strobe signal is completed,
   wherein the strobe control circuit comprises, a control signal generation circuit configured to generate a pull-up control signal, a pull-down control signal and a postamble extension signal based on the write information and the clock signal, and a strobe driving signal generation circuit configured to generate a pull-up strobe driving signal based on the clock signal and the pull-up control signal, and generate a pull-down strobe driving signal based on the clock signal, the pull-down control signal and the postamble extension signal,
   wherein the control signal generation circuit comprises, a counter configured to generate the pull-up control signal based on the write information and the clock signal, a first flip-flop configured to generate the pull-down control signal by delaying the pull-up control signal, a logic gate configured to perform an AND operation with the pull-up control signal and the pull-down control signal, and a second flip-flop configured to generate the postamble extension signal by delaying an output of the logic gate.

2. The transmission circuit according to claim 1, wherein the write information includes information on an operation for a semiconductor apparatus to perform and information on a time required for the operation.

3. The transmission circuit according to claim 1, wherein the write information includes a write latency and a burst length.

4. A transmission circuit comprising:
   a strobe control circuit configured to generate strobe driving signals based on write information and a clock signal; and
   an output driver configured to generate a strobe signal by driving signal transmission lines based on the strobe driving signals,
   wherein the signal transmission lines are driven to a specified level for a predetermined time after transmission of the strobe signal is completed,
   wherein the strobe control circuit comprises, a control signal generation circuit configured to generate a pull-up control signal, a pull-down control signal and a postamble extension signal based on the write information and the clock signal, and a strobe driving signal generation circuit configured to generate a pull-up strobe driving signal based on the clock signal and the pull-up control signal, and generate a pull-down strobe driving signal based on the clock signal, the pull-down control signal and the postamble extension signal,
   wherein the control signal generation circuit comprises, a counter configured to generate the pull-up control signal based on the write information and the clock signal, a first flip-flop configured to generate the pull-down control signal by delaying the pull-up control signal, a flip-flop array configured to generate a pulse width adjustment signal by variably delaying the pull-down control signal, a logic gate configured to perform an AND operation with an inverted signal of the pull-up control signal and the pulse width adjustment signal, and a second flip-flop configured to generate the postamble extension signal by delaying an output of the logic gate.

5. A system comprising:
   a memory; and
   a memory controller configured to transmit data and a strobe signal to the memory during a write operation,
   wherein the memory controller includes a transmission circuit which generates the strobe signal based on write information and a clock signal and drives the strobe signal to a specified level for a predetermined time after transmission of the strobe signal is completed,
   wherein the transmission circuit comprises, a strobe control circuit configured to generate strobe driving signals based on the write information and the clock signal, and an output driver configured to drive a strobe bus based on the strobe driving signals,
   wherein the strobe control circuit comprises, a control signal generation circuit configured to generate a pull-up control signal, a pull-down control signal and a postamble extension signal based on the write information and the clock signal, and a strobe driving signal generation circuit configured to generate a pull-up strobe driving signal based on the clock signal and the pull-up control signal, and generate a pull-down strobe driving signal based on the clock signal, the pull-down control signal and the postamble extension signal,
   wherein the control signal generation circuit comprises, a counter configured to generate the pull-up control signal based on the write information and the clock signal, a first flip-flop configured to generate the pull-down control signal by delaying the pull-up control signal, a logic gate configured to perform an AND operation with the pull-up control signal and the pull-down control signal, and a second flip-flop configured to generate the postamble extension signal by delaying an output of the logic gate.

6. The system according to claim 5, wherein the write information includes information on a time required for the write operation.

7. The system according to claim 5, wherein the write information includes a write latency and a burst length.

8. A system comprising:
   a memory; and
   a memory controller configured to transmit data and a strobe signal to the memory during a write operation,
   wherein the memory controller includes a transmission circuit which generates the strobe signal based on write information and a clock signal and drives the strobe signal to a specified level for a predetermined time after transmission of the strobe signal is completed,
   wherein the transmission circuit comprises, a strobe control circuit configured to generate strobe driving signals based on the write information and the clock signal, and an output driver configured to drive a strobe bus based on the strobe driving signals,
   wherein the strobe control circuit comprises, a control signal generation circuit configured to generate a pull-up control signal, a pull-down control signal and a postamble extension signal based on the write information and the clock signal, and a strobe driving signal generation circuit configured to generate a pull-up strobe driving signal based on the clock signal and the pull-up control signal, and generate a pull-down strobe driving signal based on the clock signal, the pull-down control signal and the postamble extension signal, wherein the control signal generation circuit comprises, a counter configured to generate the pull-up control signal based on the write information and the clock signal, a first flip-flop configured to generate the pull-down control signal by delaying the pull-up control signal, a flip-flop array configured to generate a pulse width adjustment signal by variably delaying the pull-down control signal, a logic gate configured to perform an AND operation with an inverted signal of the pull-up control signal and the pulse width adjustment signal, and a second flip-flop configured to generate the postamble extension signal by delaying an output of the logic gate.

9. A data transmission method between a memory and a memory controller for transmitting data to the memory, comprising:

transmitting a command signal associated with a write operation, to the memory by the memory controller; and generating a strobe signal with the memory controller and transmitting data and the strobe signal to the memory, after a time corresponding to the write latency is elapsed, wherein the memory controller generates the strobe signal for a time corresponding to a burst length, and generates the strobe signal to a specified level for a predetermined time after the time corresponding to the burst length is elapsed, wherein the generating of the strobe signal comprises, counting the time corresponding to the burst length, and enabling a pull-up control signal for the time, generating a pull-down control signal by delaying the pull-up control signal, generating a postamble extension signal by calculating the pull-up control signal and the pull-down control signal, and driving an output driver based on the pull-up control signal, the pull-down control signal and the postamble extension signal.

10. The data transmission method according to claim 9, wherein the memory receives the data in synchronization with the strobe signal.

11. The data transmission method according to claim 9, further comprising:

generating, additionally, a pulse width adjustment signal by variably delaying the pull-down control signal, and generating the postamble extension signal based on the pull-up control signal, the pull-down control signal and the pulse width adjustment signal.

* * * * *